US012242851B2

(12) United States Patent
Gopal et al.

(10) Patent No.: US 12,242,851 B2
(45) Date of Patent: Mar. 4, 2025

(54) VERIFYING COMPRESSED STREAM FUSED WITH COPY OR TRANSFORM OPERATIONS

(71) Applicant: Intel Corporation, Santa Clara, CA (US)

(72) Inventors: Vinodh Gopal, Westborough, MA (US); James D. Guilford, Northborough, MA (US); Daniel F. Cutter, Maynard, MA (US)

(73) Assignee: Intel Corporation, Santa Clara, CA (US)

( * ) Notice: Subject to any disclaimer, the term of this patent is extended or adjusted under 35 U.S.C. 154(b) by 568 days.

(21) Appl. No.: 17/470,089

(22) Filed: Sep. 9, 2021

(65) Prior Publication Data

US 2023/0075667 A1    Mar. 9, 2023

(51) Int. Cl.
*G06F 9/30* (2018.01)
*G06F 9/38* (2018.01)
(Continued)

(52) U.S. Cl.
CPC ........ *G06F 9/30145* (2013.01); *G06F 9/3808* (2013.01); *G06F 9/3867* (2013.01); *G06F 9/5027* (2013.01); *H03M 13/096* (2013.01)

(58) Field of Classification Search
CPC .. G06F 9/30145; G06F 9/3808; G06F 9/3867; G06F 9/5027; G06F 11/1004;
(Continued)

(56) References Cited

U.S. PATENT DOCUMENTS 6,049,866 A   4/2000 Earl
6,208,273 B1  3/2001 Dye et al.
(Continued)

FOREIGN PATENT DOCUMENTS

CN    103810297 A    5/2014
CN    114661227 A    6/2022
(Continued)

OTHER PUBLICATIONS

Abail, et al. "Data Compression Accelerator on IBM POWER9 and z15 Processors," ISCA 2020, 14 pages.
(Continued)

*Primary Examiner* — Shawn Doman
(74) *Attorney, Agent, or Firm* — Spectrum IP Law Group LLC

(57) ABSTRACT

Methods and apparatus relating to verifying a compressed stream fused with copy or transform operation(s) are described. In an embodiment, compression logic circuitry compresses input data and stores the compressed data in a temporary buffer. The compression logic circuitry determines a first checksum value corresponding to the compressed data stored in the temporary buffer. Decompression logic circuitry performs a decompress-verify operation and a copy operation. The decompress-verify operation decompresses the compressed data stored in the temporary buffer to determine a second checksum value corresponding to the decompressed data from the temporary buffer. The copy operation transfers the compressed data from the temporary buffer to a destination buffer in response to a match between the first checksum value and the second checksum value. Other embodiments are also disclosed and claimed.

23 Claims, 9 Drawing Sheets

Decompression Descriptor

| Byte 7 | Byte 6 | Byte 5 | Byte 4 | Byte 3 | Byte 2 | Byte 1 | Byte 0 | bytes |
|---|---|---|---|---|---|---|---|---|
| Operation | Operation Flags | | | Priv / Reserved | | PASID | 316 | 0 |
| Completion Record Address | | | | | | | | 8 |
| Source 1 Address | | | | | | 310 | | 16 |
| Destination Address | | | | | | 312 | | 24 |
| Decompression Flags | Completion Interrupt Handle | | | Source 1 Transfer Size | | | 308 | 32 |
| Source 2 Address | | | | | 318 | | | 40 |
| Source 2 Transfer Size | | | | Maximum Destination Size | | | | 48 |
| Reserved | | | | Decompress-2 Flags | | | 314 | 56 |

(51) Int. Cl.
G06F 9/50 (2006.01)
H03M 13/09 (2006.01)

(58) Field of Classification Search
CPC ............. H03M 13/096; H03M 7/3086; H03M 7/4037; H03M 7/6041
See application file for complete search history.

(56) References Cited

U.S. PATENT DOCUMENTS

| | | |
|---|---|---|
| 6,388,585 B1 | 5/2002 | Lacerda |
| 6,505,293 B1 | 1/2003 | Jourdan et al. |
| 6,625,723 B1 | 9/2003 | Jourday et al. |
| 6,862,662 B1 | 3/2005 | Cloud |
| 6,879,266 B1 | 4/2005 | Dye et al. |
| 8,447,948 B1 | 5/2013 | Erdogan et al. |
| 8,738,860 B1* | 5/2014 | Griffin ................ G06F 12/0897 711/122 |
| 9,552,169 B2 | 1/2017 | Rappoport et al. |
| 10,331,558 B2 | 6/2019 | Sazegari et al. |
| 10,671,550 B1 | 6/2020 | Doi |
| 12,028,094 B2 | 7/2024 | Gaur et al. |
| 2002/0124142 A1 | 9/2002 | Har et al. |
| 2002/0174255 A1 | 11/2002 | Hayter et al. |
| 2003/0088759 A1 | 5/2003 | Wilkerson |
| 2003/0217251 A1 | 11/2003 | Jourdan et al. |
| 2005/0160234 A1 | 7/2005 | Newburn et al. |
| 2005/0289300 A1 | 12/2005 | Kim et al. |
| 2008/0177984 A1 | 7/2008 | Lataille et al. |
| 2008/0282034 A1 | 11/2008 | Jiao et al. |
| 2010/0223237 A1 | 9/2010 | Mishra et al. |
| 2011/0072213 A1 | 3/2011 | Nickolls et al. |
| 2011/0208918 A1 | 8/2011 | Raikin et al. |
| 2013/0111605 A1 | 5/2013 | Maeda et al. |
| 2014/0095814 A1 | 4/2014 | Marden et al. |
| 2014/0281240 A1 | 9/2014 | Willhalm |
| 2014/0317377 A1 | 10/2014 | Ould-Ahmed-Vall et al. |
| 2015/0106567 A1 | 4/2015 | Godard et al. |
| 2015/0178202 A1 | 6/2015 | Sankaran et al. |
| 2015/0178214 A1 | 6/2015 | Alameldeen et al. |
| 2015/0378731 A1 | 12/2015 | Lai et al. |
| 2016/0092373 A1 | 3/2016 | Doshi et al. |
| 2016/0179676 A1 | 6/2016 | Engh-Halstvedt et al. |
| 2016/0321076 A1 | 11/2016 | Satpathy et al. |
| 2016/0321185 A1 | 11/2016 | Doshi et al. |
| 2016/0328172 A1 | 11/2016 | Rappoport et al. |
| 2017/0220475 A1 | 8/2017 | Bradbury et al. |
| 2017/0371660 A1 | 12/2017 | Smith et al. |
| 2018/0011796 A1 | 1/2018 | Guilford et al. |
| 2018/0152201 A1* | 5/2018 | Gopal ................ H04L 12/4633 |
| 2018/0165097 A1 | 6/2018 | Hanley |
| 2019/0034335 A1 | 1/2019 | Torre et al. |
| 2019/0042354 A1 | 2/2019 | Coquerel et al. |
| 2019/0044852 A1* | 2/2019 | Nolan .................. H04L 45/306 |
| 2019/0034333 A1 | 6/2019 | Sazegari et al. |
| 2019/0391869 A1* | 12/2019 | Gopal ................ G06F 11/1004 |
| 2020/0190807 A1 | 6/2020 | Header |
| 2020/0249948 A1 | 8/2020 | Giamei et al. |
| 2021/0035258 A1 | 2/2021 | Ray et al. |
| 2021/0072994 A1 | 3/2021 | Bainville et al. |
| 2021/0103550 A1 | 4/2021 | Appu et al. |
| 2021/0114495 A1 | 4/2021 | Battaglia et al. |
| 2021/0312697 A1 | 10/2021 | Maiyuran et al. |
| 2021/0374897 A1 | 12/2021 | Ray et al. |
| 2022/0066931 A1 | 3/2022 | Ray et al. |
| 2022/0197643 A1 | 6/2022 | Gaur et al. |
| 2022/0197659 A1 | 6/2022 | Gaur et al. |
| 2022/0197794 A1 | 6/2022 | Kallurkar et al. |
| 2022/0197799 A1 | 6/2022 | Gaur et al. |
| 2022/0197813 A1 | 6/2022 | Gaur et al. |
| 2022/0272569 A1* | 8/2022 | Berliner ................ H04L 1/1896 |
| 2022/0295345 A1* | 9/2022 | Trim ..................... H04W 28/06 |

FOREIGN PATENT DOCUMENTS

| | | |
|---|---|---|
| CN | 114661359 A | 6/2022 |
| CN | 114661625 A | 6/2022 |
| CN | 115793960 | 3/2023 |
| CN | 116263671 A | 6/2023 |
| EP | 4020185 A1 | 6/2022 |
| EP | 4020223 A1 | 6/2022 |
| EP | 4020230 A1 | 6/2022 |
| EP | 4020231 A1 | 6/2022 |
| EP | 4149008 A1 | 3/2023 |
| EP | 4198749 A1 | 6/2023 |
| JP | H0922353 A | 1/1997 |
| WO | 2020190807 A1 | 9/2020 |
| WO | 2020190799 A3 | 10/2020 |

OTHER PUBLICATIONS

Cao et al. "Characterizing, Modeling, and Benchmarking RocksDB Key-Value Workloads at Facebook," FAST 2020, retrieved from https://b;log.acolyer.org/2020/03/11/rocks-db-at-facebook/ on Nov. 19, 2020, 12 pages.

Examination report issued by the European Patent Office for Application No. 21198874.6-1203, issued Jan. 19, 2023, 6 pages.

Extended European Search Report issued on Apr. 7, 2022 for EP Application No. 21198710.2.

Extended European Search Report issued on Mar. 16, 2022 for EP Application No. 21198874.6.

Lagar-Cavilla et al. "Software-Defined Far Memory in Warehouse-Scale Computers," ASPLOS 2019, retrieved from https://blog.acolyer.org/2019/05/22/sw-far-memory/ on Nov. 19, 2020, 11 pages.

Andreas Abel et al., Measurement-based Modeling of the Cache Replacement Policy, 2013 IEEE 19th Real-Time and Embedded Technology and Applications Symposium (RTAS), 10 pages.

Kanev et al., "Profiling a Warehouse-Scale Computer," ISCA'15, Jun. 13-17, 2015, 12 pages.

Non-final Office Action issued in U.S. Appl. No. 17/133,615, filed Feb. 15, 2024, 16 pages.

Colyer, Adrian, "Software-defined far memory in warehouse scale computers," The Morning Paper, 13 pages, May 22, 2019.

Lagar-Cavilla, Andres, et al. "Software-Defined Far Memory in Warehouse-Scale Computers," Session: VM/Memory, ASPLOS '19, Apr. 13-17, 2019, Providence, Rhode Island, pp. 317-330.

Decision to grant European patent for Application No. 21198841.5, Apr. 5, 2024, 2 pages.

European Examination Report, application No. 21198874.6, Oct. 23, 2023, 7 pages.

Extended European Search Report issued on Mar. 1, 2022 for EP Application No. 2119770.4.

Extended European Search Report issued on Mar. 1, 2022 for EP Application No. 21198841.5.

Office Action issued for U.S. Appl. No. 17/133,624, mailed Mar. 4, 2024, 12 pages.

Andreas Abel et al., Reverse Engineering of Cache Replacement Policies in Intel Microprocessors and Their Evaluation, 2014 IEEE International Symposium on Performance Analysis of Systems and Software (ISPASS), 3 pages.

Ayers et al., "Asmdb: understanding and mitigating front-end stalls in warehouse-scale computers," ISCA '19, Jun. 22-26, 2019, 12 pages.

Extended European search report for application No. 22206038.6, issued May 12, 2023, 12 pages.

Final Office Action issued in U.S. Appl. No. 17/133,618, issued Jun. 28, 2024, 17 pages.

Glenn Reinmany et al., Fetch Directed Instruction Prefetching. International Symposium on Microarchitecture (MICRO-32), Nov. 1999, 12 pages.

Pepe Vila et al., CacheQuery: learning replacement policies from hardware caches, 2020 ACM SIGPLAN Conference on Programming Language Design and Implementation, 17 pages.

Reinman et al., "Fetch Directed Instruction Prefetching," Proceedings of the 32nd Annual International Symposium on Microarchitecture (MICRO-32), Nov. 1999, 12 pages.

(56) References Cited

OTHER PUBLICATIONS

Zswap, The Linux Kernel documentation, Linux Memory Management Documentation, retrieved from www.kernel.org/doc/html/latest/vm/zswap.html on Aug. 29, 2021.
Extended European Search Report for application No. 22188197.2-1224, issued Feb. 3, 2023, 10 pages.
European Examination report for application No. 22188197.2, issued Aug. 28, 2024, 6 pages.
European Patent Office communication regarding Intention to Grant for application No. 21197700.4, issued Jul. 30, 2024, 78 pages.
Intention to Grant Notice issued by the European Patent Office for application No. 22206038.6, issued Jul. 8, 2024, 52 pages.
Notice of Intent to Grant from the European Patent Office for application No. 21198710.2, issued Aug. 2, 2024, 87 pages.
European Patent Office, Notice of Grant for Application No. 21198841.5, issued Dec. 14, 2023, 80 pages.
Notice of Allowance in U.S. Appl. No. 17/133,622, mailed Feb. 29, 2024, 8 pages.
Examination report for European Application No. 22206038.6, issued Feb. 21, 2024, 8 pages.
Non-Final Office Action from S/N U.S. Appl. No. 17/133,618, mailed Mar. 15, 2024, 18 pages.

\* cited by examiner

Decompression Descriptor

| Byte 7 | Byte 6 | Byte 5 | Byte 4 | Byte 3 | Byte 2 | Byte 1 | Byte 0 | bytes |
|---|---|---|---|---|---|---|---|---|
| Operation | Operation Flags | | | Priv / Reserved | | PASID 316 | | 0 |
| Completion Record Address | | | | | | | | 8 |
| Source 1 Address | | | | | | 310 | | 16 |
| Destination Address | | | | | | 312 | | 24 |
| Decompression Flags | Completion Interrupt Handle | | | Source 1 Transfer Size 308 | | | | 32 |
| Source 2 Transfer Size | Source 2 Address 318 | | | | Maximum Destination Size | | | 40 |
| Reserved | | | | | Decompress-2 Flags 314 | | | 48 |
| | | | | | | | | 56 |

FIG. 3

VERIFYING COMPRESSED STREAM FUSED WITH COPY OR TRANSFORM OPERATIONS

FIELD

The present disclosure generally relates to the field of electronics. More particularly, an embodiment relates to verifying a compressed stream fused with copy or transform operation(s).

BACKGROUND

Computing systems include multiple tiers of memory. These different tiers of memory generally include smaller memory (e.g., Dynamic Random Access Memory (DRAM)) as well as larger memory (such as storage media). The smaller memory is faster than the larger memory and data that is to be immediately consumed by a processor is generally stored in the faster/smaller memory before it is transferred to the larger/slower memory.

To increase storage capacity, data that is to be stored in the smaller/faster memory can be compressed. However, compression (and subsequent decompression) of data can negatively impact the overall system performance and latency.

BRIEF DESCRIPTION OF THE DRAWINGS

The detailed description is provided with reference to the accompanying figures. In the figures, the left-most digit(s) of a reference number identifies the figure in which the reference number first appears. The use of the same reference numbers in different figures indicates similar or identical items.

FIG. 3 illustrates a decompression descriptor for verifying a compressed stream fused with copy or transform operation(s), according to an embodiment.

DETAILED DESCRIPTION

Figure 1:
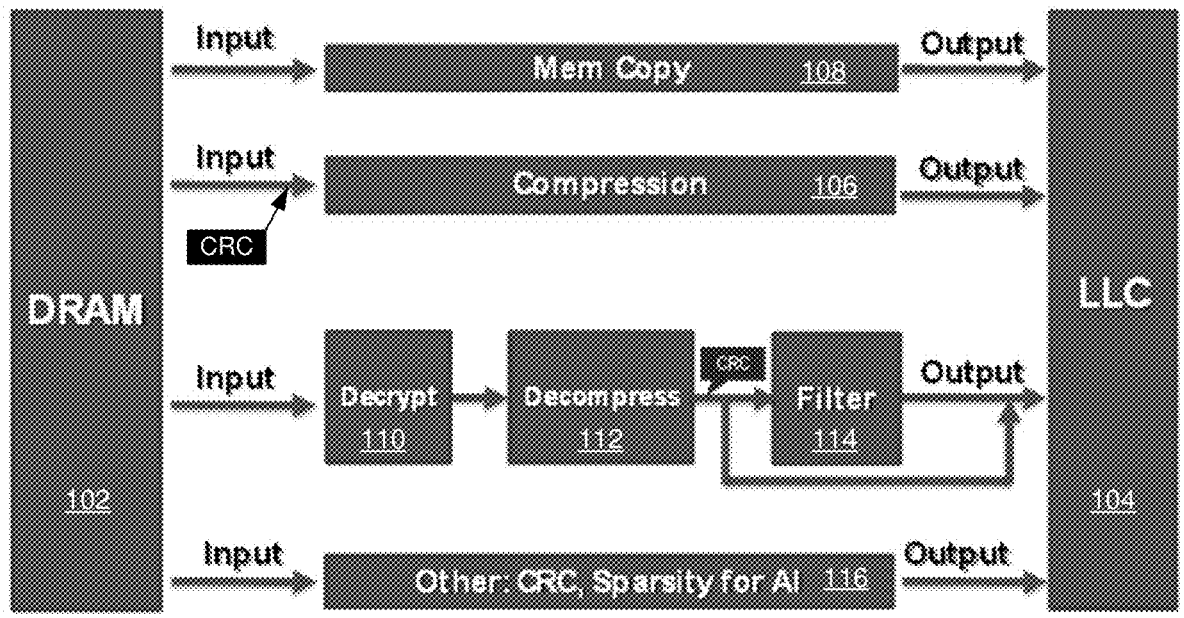
FIG. 1 illustrates a block diagram of various components of a system for compression-decompression which may be used in some embodiments.

In the following description, numerous specific details are set forth in order to provide a thorough understanding of various embodiments. However, various embodiments may be practiced without the specific details. In other instances, well-known methods, procedures, components, and circuits have not been described in detail so as not to obscure the particular embodiments. Further, various aspects of embodiments may be performed using various means, such as integrated semiconductor circuits ("hardware"), computer-readable instructions organized into one or more programs ("software"), or some combination of hardware and software. For the purposes of this disclosure reference to "logic" shall mean either hardware (such as logic circuitry or more generally circuitry or circuit), software, firmware, or some combination thereof.

As mentioned above, data stored in a smaller/faster memory (such as DRAM or more generally Random Access Memory (RAM)) may be first compressed to increase the effective storage capacity. The compression/decompression operations may be performed at a memory page level. Use of compression at the page level to create memory hierarchy or tiers is becoming very important, e.g., to allow for storage of larger amounts of data in faster memory. The basic idea is that rather than paging memory pages out to disk or other non-volatile memory, one would instead compress the data and store it in faster memory. The goal is to increase the effective memory capacity but with much better performance than swapping to a slower tier such as storage media. The ideal performance goal is to maximize the memory savings (via page compression) with nearly zero performance impact to applications, compared to running on a system with a much larger DRAM capacity (and no compression). Hence, reducing compression latency and decompression latency would tremendously aid in this goal.

To this end, some embodiments provide one or more techniques for verifying a compressed stream fused with copy or transform operation(s). In an embodiment, a hardware compression or decompression accelerator logic (such as "IAX™" or "Intel Analytics Accelerator" provided by Intel® Corporation of Santa Clara, California) is used to reduce compression/decompression latency, while maximizing the compression ratio achieved (e.g., and thereby providing dynamic memory (e.g., RAM/DRAM/etc.) usage savings).

By contrast, some current methods of compression consists of multiple steps. When a memory page is to be compressed, its compressed size cannot be known a priori. To find a destination buffer in the compressed DRAM tier, one needs to know the compressed size (which needs to be provided as input to the allocate call). This chicken-and-egg problem is traditionally solved by compressing once to determine the size (but suppressing or discarding the output), allocating the memory using the size, and then issuing the real/actual compression operation with the destination buffer that was allocated.

Since compression is an expensive operation, another approach is to compress to a temporary buffer, allocate the destination buffer using the determined size, and then copy data to the new destination buffer. In addition to these steps, for ultra-reliable systems, Content Service Providers (CSPs) aim to minimize any Silent Data Corruption (SDC) errors that can be introduced during transformation operations such as compress or encrypt, and to this end they issue another operation to decompress and verify that the compressed data was correct before committing the page swap operation. Thus, in this scenario, three operations need to be performed during the compression of a memory page; hence, three tasks need to be performed by a compression/decompression accelerator.

To address these issues, an embodiment eliminates at least one of these three tasks by fusing two or more operations, thereby improving performance of the accelerator proportionally. As a result, some embodiments can improve the compression performance for the deflate compression algorithm with minimal area cost and design complexity.

Moreover, an embodiment creates a new mode of operation for a compression/decompression accelerator logic (such as in TAX) for fusing an extra copy operation to the decompress-verify operation. The decompress-verify operation is similar to a regular decompression, but suppresses or otherwise does not use the output from the decompressor logic. The output is only used internally to calculate a checksum or Cyclic Redundancy Code (CRC) that is compared against the one that was generated on the input to the compressor. When these match, it indicates the compressed bitstream does not have any errors and can regenerate the input; the input can therefore be discarded and the compressed data can be committed.

This new mode fuses an additional operation such as copy the input stream to the output stream. So, the decompressor works on the input and generates an internal uncompressed stream to calculate the checksum/CRC, while a parallel hardware logic block copies the input stream to the output (with other optional transform operations if needed). This allows the memory page decompression flow to complete with two accelerator tasks instead of three.

Figure 2:
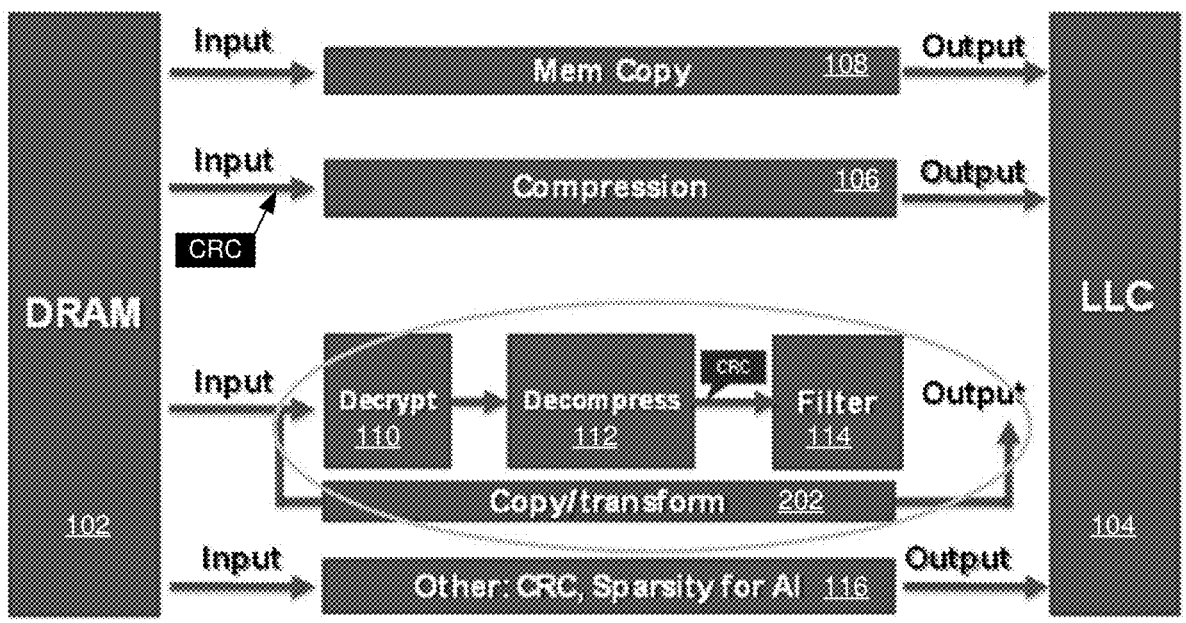
FIG. 2 illustrates a block diagram of a compression-decompression logic, according to an embodiment.

FIG. 1 illustrates a block diagram of various components of a system for compression-decompression which may be used in some embodiments. As shown, input from DRAM 102 may be received at various components and, after processing, stored in a cache 104 (e.g., Last Level Cache (LLC)). While some embodiments shown/discussed indicate input data is obtained from DRAM and output stored in a cache, embodiments are not limited to this and input data may be stored in any memory device (such as those discussed with reference to FIGS. 6-10, including a RAM, cache, non-volatile memory, etc.) and the output data may be stored in any memory device (such as those discussed with reference to FIGS. 6-10, including a RAM, cache, non-volatile memory, etc.). As a result, the data could be transferred from DRAM and end up in LLC (such as shown in FIGS. 1-2) or it could alternatively be transferred from an LLC to an LLC, DRAM to DRAM, etc. Further, the memory device used to store the input data is assumed to be faster than the memory device that stores the output data in most implementations.

For compression, data is read from the DRAM 102, compressed by compression logic 106, and stored in the cache 104. As shown in FIG. 1, the CRC is computed on the input to the compression logic 106 and later compared with a CRC from the output of the decompression logic 112 (as will be further discussed with reference to FIG. 4, for example). For uncompressed copying, memory copy logic 108 simply copies data from the DRAM 102 to the cache 104. For decompression, data input from DRAM 102 is first decrypted (if necessary) by decryption logic 110. The decrypted data is then decompressed by decompression logic 112. As shown in FIG. 1, a checksum/CRC check may be optionally performed by decompression logic 112. The decompressed data generated by the decompression logic 112 may then be passed either directly or through filter logic 114 to the cache 104. In an embodiment, the filter logic 114 performs operations on the data that might typically be used for columnar databases, such as scan, extract, etc.

As shown in FIG. 1, another logic 116 may perform other tasks such as checking checksums/CRCs, perform sparsity operations for Artificial Intelligence (AI) tasks, etc. Moreover, these other operations by logic 116 may primarily include CRC and zero compression/decompression. These last ones may be a non-standard "lightweight" compression scheme that just removes 0's (more particularly zero bytes, zero words, or zero DWORDS) from the uncompressed data. One application for this is compression of spare matrices (or matrices that contain a lot of zero elements, e.g., for AI applications, labeled as "sparsity" in FIGS. 1-2), but it is not limited to that.

FIG. 2 illustrates a block diagram of a compression-decompression logic, according to an embodiment. While some components of FIG. 2 may be the same or similar to the components of FIG. 1 (as indicated by use of the same reference numerals), FIG. 2 illustrates how a copy/transform logic 202 may perform a copy/transform operation (e.g., in parallel or substantially simultaneously with the decryption/decompression/filtering operations) in accordance with one embodiment.

In at least one embodiment, the compression/decompression accelerator logic discussed is capable to operate on virtual addresses. Hence, the compression/decompression accelerator logic may include a Translation Lookaside Buffer (TLB) or other logic to translate virtual addresses into physical addresses and vice versa.

FIG. 3 illustrates a decompression descriptor 300 for verifying a compressed stream fused with copy or transform operation(s), according to an embodiment. The decompression descriptor 300 may be used by the decompression logic 106 of FIG. 1 or 2 to determine specific information/operation(s) to be used/performed during decompression. While some embodiments are discussed with reference to specific bits in the descriptor 300, embodiments are not limited to these specific bits and any bit value in any storage device (such as a register, a cache, DRAM, NVM, etc.) may be used for the specific purposed listed.

Moreover, an embodiment adds a memory-page copy functionality to the decompress-verify task discussed above. As discussed further below, an instruction may cause addition of the copy functionality to the decompress-verify task when an opcode "decompress" is present in the instruction. Two flag bits of interest are decompression flags 302 bit 9 (indicating disablement of the normal output) and decompress-2 flags 314 bit 0 (indicating enablement of verify-copy operation). In one embodiment, the "copy-verify feature could only be used if a "suppress output" flag has been also enabled (the output here refers to the data generated by the decompression logic 112). There may also be a descriptor checker logic included (not shown) that when this mode is enabled, max-dest-size (maximum destination size) field 306 has to be at least as big as the source 1 size 308.

When verify-copy is enabled, the decompression logic copies the input to the output as part of (or substantially simultaneously) performing the decompress-verify operation. The data copied would be the data from the source 1 address 310 to the destination address 312. And similarly, if the decryption logic 110 is enabled, the compression/decompression logic copies the input to decrypt rather than the input to decompress in an embodiment. In FIG. 3, "PASID" 316 or Physical Address Space ID (Identifier) is inserted automatically by an enqueue command, and it informs the accelerator which address translation tables should be used to map from virtual to physical addresses. Further, "Source 2 Address" 318 may be used as an address pointing to additional data for one or more of the following purposes: (1) to supply a second data stream to some of the filter operations; (2) to supply parameters that do not fit into the descriptor 300 (e.g. cryptographic keys); (3) to save and restore state when one logical operation is broken into multiple physical operations (e.g., decompressing a 1 MB file by processing 64 KB at a time).

Conceptually, the data that has been written to the output was the data that came into the processor core (i.e., into the cryptographic or decompress input accumulator). This is opposed to, for example, the data going out of the input accumulators. Thus, any initial data in the input accumulators, when the state structure for the compression/decompression logic is read, would not be written, just data being consumed from source 1 address 310.

Furthermore, if there is a decompress error, the results of the copy are undefined (i.e., one cannot assume any data was copied). If the output buffer is smaller than source 1 buffer, an overflow output is generated.

Figure 4:
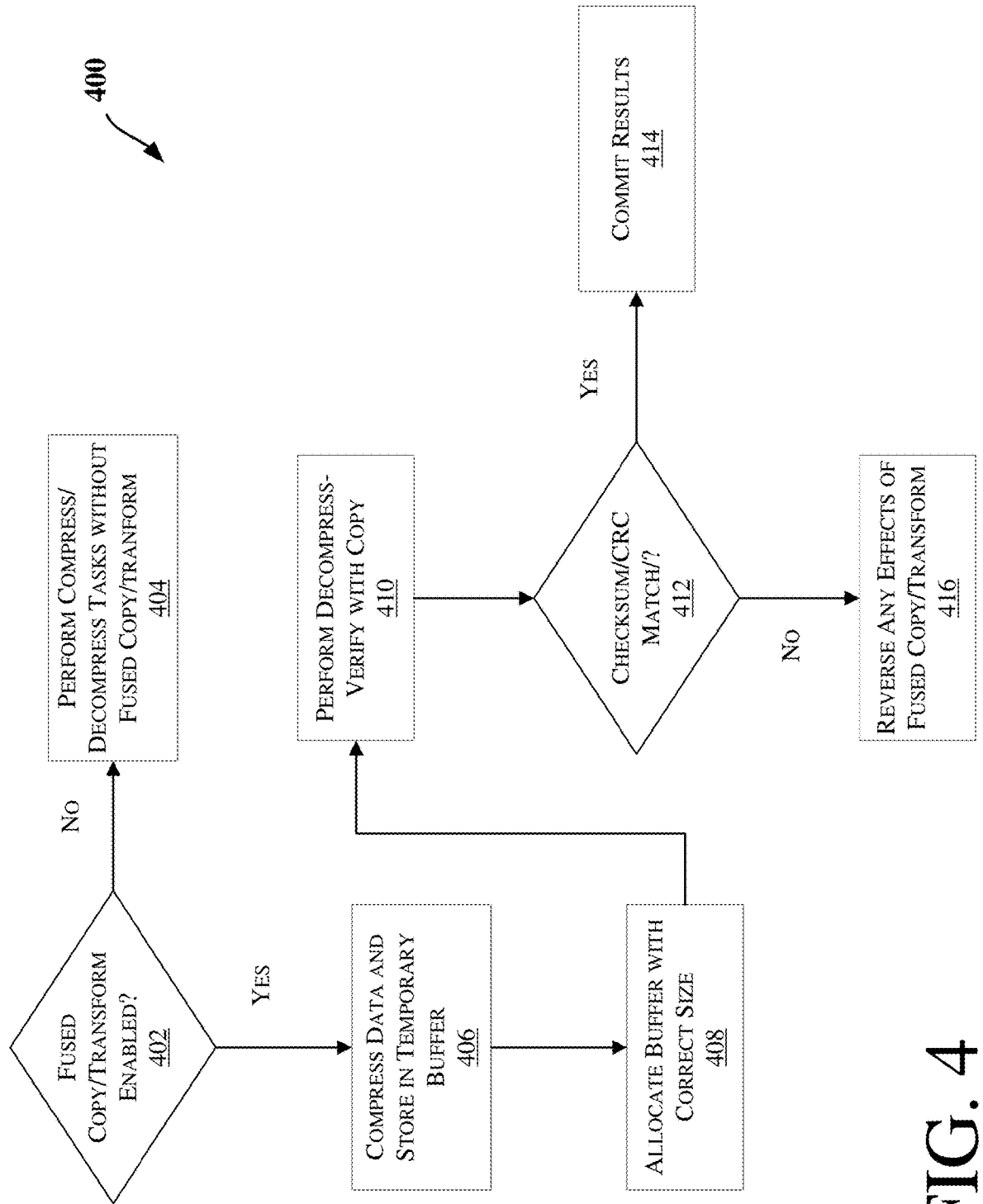
FIG. 4 illustrates a flow diagram of a method to verify a compressed stream fused with copy or transform operation(s), according to an embodiment.

FIG. 4 illustrates a flow diagram of a method 400 to verify a compressed stream fused with copy or transform operation(s), according to an embodiment. One or more of the operations of method 400 may be performed by one or more components of FIGS. 1-3, such as discussed herein, including logic 106 and/or logic 202, for example.

In one embodiment, an Operating System (OS) will cause performance of data compression using a compression/decompression accelerator logic with an improved flow for decompression. Moreover, for memory tiering, the use of this feature is generally in the page-swap logic which would be in the kernel and, hence, rely on the OS to cause performance of the compression using an accelerator with an improved flow for decompression; however, embodiments are not limited to use of OS and an application that is running in the user space and compressing/decompressing data may also trigger the performance of compression using an accelerator with improved flow for decompression. Referring to FIGS. 1-4, operation 402 determines whether a fused copy/transform feature is enabled such as discussed with reference to the flag of FIG. 3. In an embodiment, an instruction may include a field that when decoded causes the determination of whether the fused copy/transform feature is enabled at operation 402. In one embodiment, an (e.g., enqueue) instruction takes (e.g., 64 bytes of) data from a memory buffer, updates the PASID 316, and sends the data to the accelerator. Hence, the instruction may not be aware of the details of the accelerator. For example, there may not be any flags in the instruction. Thereafter, the data sent to the accelerator (not the address in at least one embodiment) and the accelerator may be unaware of the adder for the descriptor. In an alternative embodiment, the instruction may include the field to either directly indicate the enablement of this feature or the field may point to (e.g., via an address) a storage location such as a decompression descriptor with a corresponding indication (e.g., as discussed with reference to FIG. 3). The same instruction or a separate instruction may further cause enqueuing of a request for the fused copy/transform operation(s) with or without the actual data, e.g., in a queue of the decompression logic 112 and/or copy/transform logic 202, in some embodiments. In an embodiment, the enqueue request may originate from a user space, e.g., bypassing a kernel or OS.

At operation 404 (e.g., performed by a compression/decompression accelerator), if the fused copy/transform feature is not enabled, the compression/decompression tasks are performed without a fused copy/transform operation. If the fused copy/transform feature is enabled, operation 406 (e.g., using logic 112 or a compression/decompression accelerator) compresses the input data (e.g., at memory page granularity) and stores the compressed data in a temporary buffer. When compressing the data at operation 406, the size of the compressed data is unknown until the end of the compression operation, which may then be determined based on how much space the compressed data consumes in the temporary buffer.

At an operation 408, memory allocation logic allocates a buffer having a size that matches the compressed data, e.g., as determined at operation 406. In some embodiments, managing of buffers is handled in software, e.g., by OS kernel code. Hence, software can be responsible for managing buffers, setting up the descriptor, invoking the accelerator, etc. In turn, hardware logic circuitry (such as a cache or memory controller/circuitry, including for example those discussed with reference to FIG. 6 et seq.) performs what the software instructs it to do. In one embodiment, the allocated size is greater or equal to the size of the compressed data at operation 406. At operation 410 (e.g., performed by a compression/decompression accelerator or logic 112), a decompress-verify with copy operation is performed to copy the decompressed data from the temporary buffer of operation 406 to a destination buffer determined at operation 408, with the data size determined after operation 406. In various embodiments, the temporary buffer and/or the destination buffer may be stored in any memory device discussed herein (e.g., with reference to FIG. 6 et seq.), including a DRAM, RAM, or cache.

At operation 412 (e.g., performed by a compression/decompression accelerator such as discussed with reference to FIGS. 1-2), it is determined whether the checksum/CRC value from operation 410 (input to compression) matches the checksum/CRC value from operation 406 (output of decompression). Once the checksum/CRC match is verified, the OS will commit the compressed data/page(s) into the compressed tier, discards the original page, deallocates the temporary/destination buffers, and/or returns to the user application at operation 414. Later on when this compressed data/page(s) are accessed, a page fault will be triggered causing the OS to call on the compression/decompression logic to decompress the data/page(s) from this location and restore/map it to the corresponding user space. Otherwise, at operation 416, if the checksum/CRC match fails, the OS causes deallocation of the temporary and destination buffers and the uncompressed data remains available.

Figure 5:
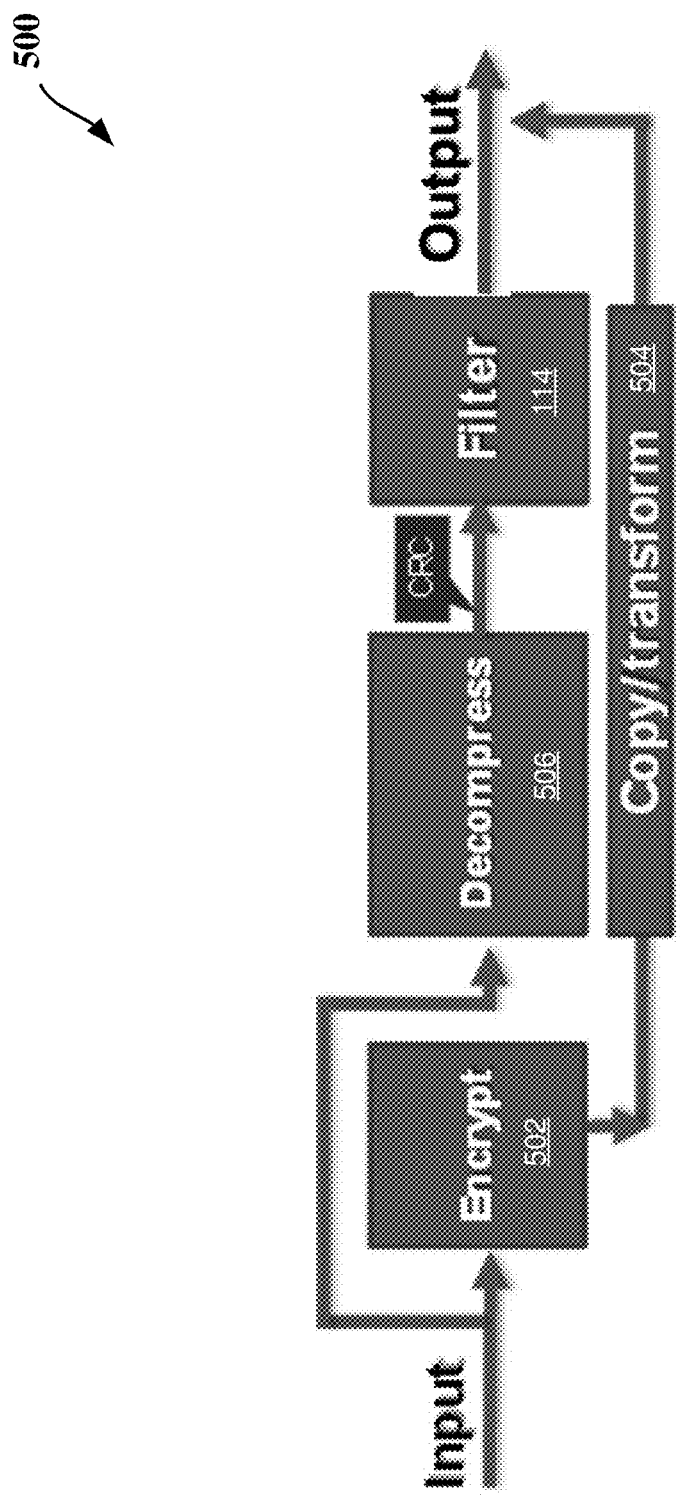
FIG. 5 illustrates a block diagram of decompressor pipeline, according to an embodiment.
Figure 6:
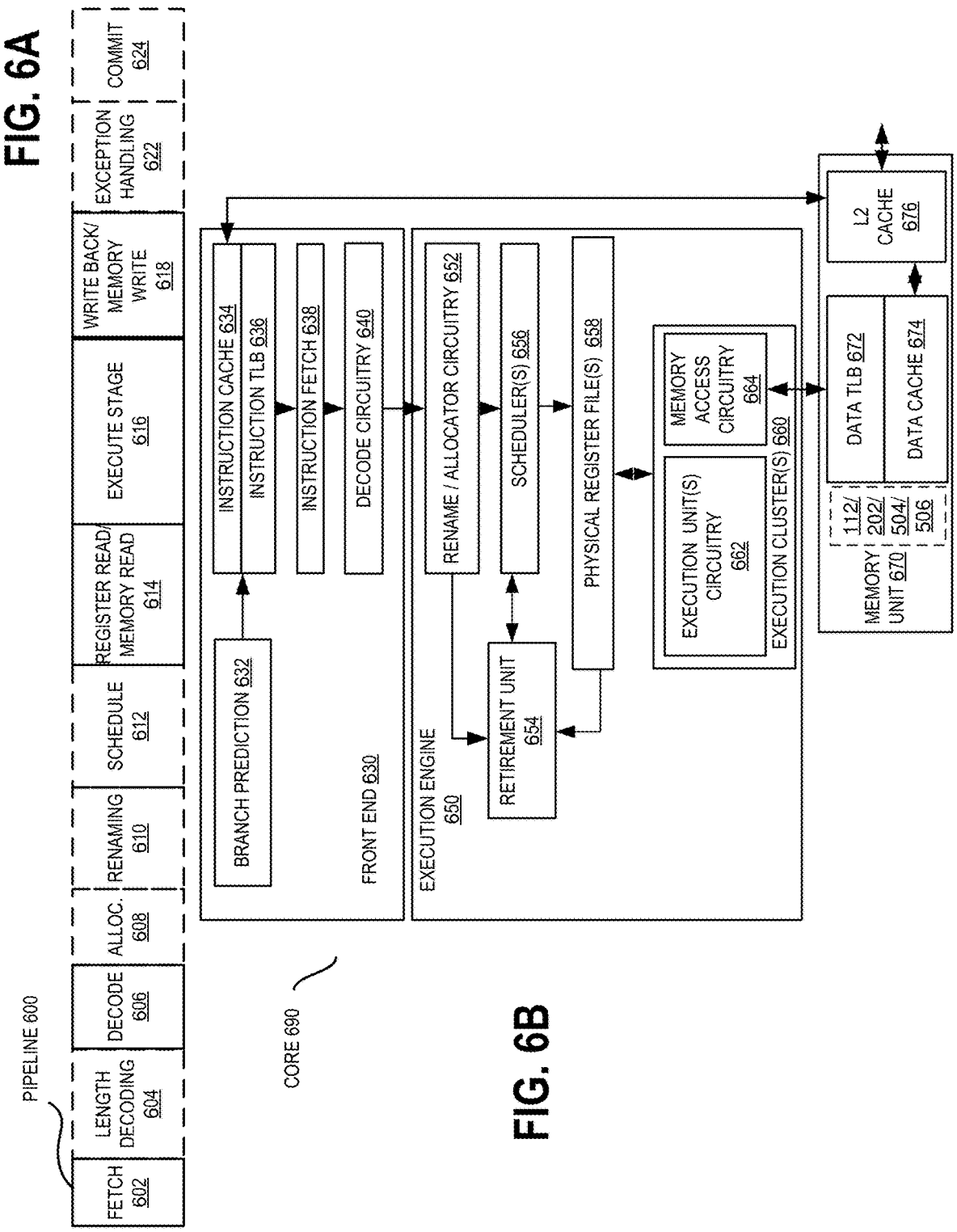
FIG. 6A is a block diagram illustrating both an exemplary in-order pipeline and an exemplary register renaming, out-of-order issue/execution pipeline according to embodiments.
FIG. 6B is a block diagram illustrating both an exemplary embodiment of an in-order architecture core and an exemplary register renaming, out-of-order issue/execution architecture core to be included in a processor according to embodiments.

FIG. 5 illustrates a block diagram of decompressor pipeline 500, according to an embodiment. In various embodiments, components 502, 504, 506, and 114 may be similar to or the same as those discussed with reference to FIGS. 1-4. In one embodiment, if the mode of operation discussed with reference to FIGS. 1-4 is expanded, other useful functions may be created to work in parallel in addition to the copy/transform operation(s). One such operation is encryption. For example, a compression/decompression logic may also perform encryption operation(s) without additional hardware added to the compression pipeline. More particularly, the cipher block in the decompression pipeline may be reused to encrypt the compressed stream enroute to the destination buffer. This is illustrated in FIG. 5 by the input being fed to the encryption logic 502 and copy/transform logic 504, without passing the encrypted data to the decompression logic 506.

Additionally, some embodiments may be applied in computing systems that include one or more processors (e.g., where the one or more processors may include one or more processor cores), such as those discussed with reference to FIG. 1 et seq., including for example a desktop computer, a work station, a computer server, a server blade, or a mobile computing device. The mobile computing device may include a smartphone, tablet, UMPC (Ultra-Mobile Personal Computer), laptop computer, Ultrabook™ computing device, wearable devices (such as a smart watch, smart ring, smart bracelet, or smart glasses), etc.

Exemplary Core Architectures, Processors, and Computer Architectures

Processor cores may be implemented in different ways, for different purposes, and in different processors. For instance, implementations of such cores may include: 1) a general purpose in-order core intended for general-purpose computing; 2) a high performance general purpose out-of-order core intended for general-purpose computing; 3) a special purpose core intended primarily for graphics and/or scientific (throughput) computing. Implementations of different processors may include: 1) a CPU (Central Processing Unit) including one or more general purpose in-order cores intended for general-purpose computing and/or one or more general purpose out-of-order cores intended for general-purpose computing; and 2) a coprocessor including one or more special purpose cores intended primarily for graphics and/or scientific (throughput). Such different processors lead to different computer system architectures, which may include: 1) the coprocessor on a separate chip from the CPU; 2) the coprocessor on a separate die in the same package as a CPU; 3) the coprocessor on the same die as a CPU (in which case, such a coprocessor is sometimes referred to as special purpose logic, such as integrated graphics and/or scientific (throughput) logic, or as special purpose cores); and 4) a system on a chip that may include on the same die the described CPU (sometimes referred to as the application core(s) or application processor(s)), the above described coprocessor, and additional functionality. Exemplary core architectures are described next, followed by descriptions of exemplary processors and computer architectures.

Exemplary Core Architectures

FIG. 6A is a block diagram illustrating both an exemplary in-order pipeline and an exemplary register renaming, out-of-order issue/execution pipeline according to embodiments. FIG. 6B is a block diagram illustrating both an exemplary embodiment of an in-order architecture core and an exemplary register renaming, out-of-order issue/execution architecture core to be included in a processor according to embodiments. The solid lined boxes in FIGS. 6A-B illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

In FIG. 6A, a processor pipeline 600 includes a fetch stage 602, a length decode stage 604, a decode stage 606, an allocation stage 608, a renaming stage 610, a scheduling (also known as a dispatch or issue) stage 612, a register read/memory read stage 614, an execute stage 616, a write back/memory write stage 618, an exception handling stage 622, and a commit stage 624.

FIG. 6B shows processor core 690 including a front end unit 630 coupled to an execution engine unit 650, and both are coupled to a memory unit 670. The core 690 may be a reduced instruction set computing (RISC) core, a complex instruction set computing (CISC) core, a very long instruction word (VLIW) core, or a hybrid or alternative core type. As yet another option, the core 690 may be a special-purpose core, such as, for example, a network or communication core, compression engine, coprocessor core, general purpose computing graphics processing unit (GPGPU) core, graphics core, or the like.

The front end unit 630 includes a branch prediction unit 632 coupled to an instruction cache unit 634, which is coupled to an instruction translation lookaside buffer (TLB) 636, which is coupled to an instruction fetch unit 638, which is coupled to a decode unit 640. The decode unit 640 (or decoder) may decode instructions, and generate as an output one or more micro-operations, micro-code entry points, microinstructions, other instructions, or other control signals, which are decoded from, or which otherwise reflect, or are derived from, the original instructions. The decode unit 640 may be implemented using various different mechanisms. Examples of suitable mechanisms include, but are not limited to, look-up tables, hardware implementations, programmable logic arrays (PLAs), microcode read only memories (ROMs), etc. In one embodiment, the core 690 includes a microcode ROM or other medium that stores microcode for certain macroinstructions (e.g., in decode unit 640 or otherwise within the front end unit 630). The decode unit 640 is coupled to a rename/allocator unit 652 in the execution engine unit 650.

The execution engine unit 650 includes the rename/allocator unit 652 coupled to a retirement unit 654 and a set of one or more scheduler unit(s) 656. The scheduler unit(s) 656 represents any number of different schedulers, including reservations stations, central instruction window, etc. The scheduler unit(s) 656 is coupled to the physical register file(s) unit(s) 658. Each of the physical register file(s) units 658 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. In one embodiment, the physical register file(s) unit 658 comprises a vector registers unit, a writemask registers unit, and a scalar registers unit. These register units may provide architectural vector registers, vector mask registers, and general purpose registers. The physical register file(s) unit(s) 658 is overlapped by the retirement unit 654 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 654 and the physical register file(s) unit(s) 658 are coupled to the execution cluster(s) 660. The execution cluster(s) 660 includes a set of one or more execution units 662 and a set of one or more memory access units 664. The execution units 662 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 656, physical register file(s) unit(s) 658, and execution cluster(s) 660 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 664).

It should also be understood that where separate pipelines are used, one or more of these pipelines may be out-of-order issue/execution and the rest in-order.

The set of memory access units 664 is coupled to the memory unit 670, which includes a data TLB unit 672 coupled to a data cache unit 674 coupled to a level 2 (L2) cache unit 676. In one exemplary embodiment, the memory access units 664 may include a load unit, a store address unit, and a store data unit, each of which is coupled to the data TLB unit 672 in the memory unit 670. The instruction cache unit 634 is further coupled to a level 2 (L2) cache unit 676 in the memory unit 670. The L2 cache unit 676 is coupled to one or more other levels of cache and eventually to a main memory.

By way of example, the exemplary register renaming, out-of-order issue/execution core architecture may implement the pipeline 600 as follows: 1) the instruction fetch 638 performs the fetch and length decoding stages 602 and 604; 2) the decode unit 640 performs the decode stage 606; 3) the rename/allocator unit 652 performs the allocation stage 608 and renaming stage 610; 4) the scheduler unit(s) 656 performs the schedule stage 612; 5) the physical register file(s) unit(s) 658 and the memory unit 670 perform the register read/memory read stage 614; the execution cluster 660 perform the execute stage 616; 6) the memory unit 670 and the physical register file(s) unit(s) 658 perform the write back/memory write stage 618; 6) various units may be involved in the exception handling stage 622; and 8) the retirement unit 654 and the physical register file(s) unit(s) 658 perform the commit stage 624.

The core 690 may support one or more instructions sets (e.g., the x86 instruction set (with some extensions that have been added with newer versions); the MIPS instruction set of MIPS Technologies of Sunnyvale, CA; the ARM instruction set (with optional additional extensions such as NEON) of ARM Holdings of Sunnyvale, CA), including the instruction(s) described herein. In one embodiment, the core 690 includes logic to support a packed data instruction set extension (e.g., AVX1, AVX2), thereby allowing the operations used by many multimedia applications to be performed using packed data.

Figure 7:
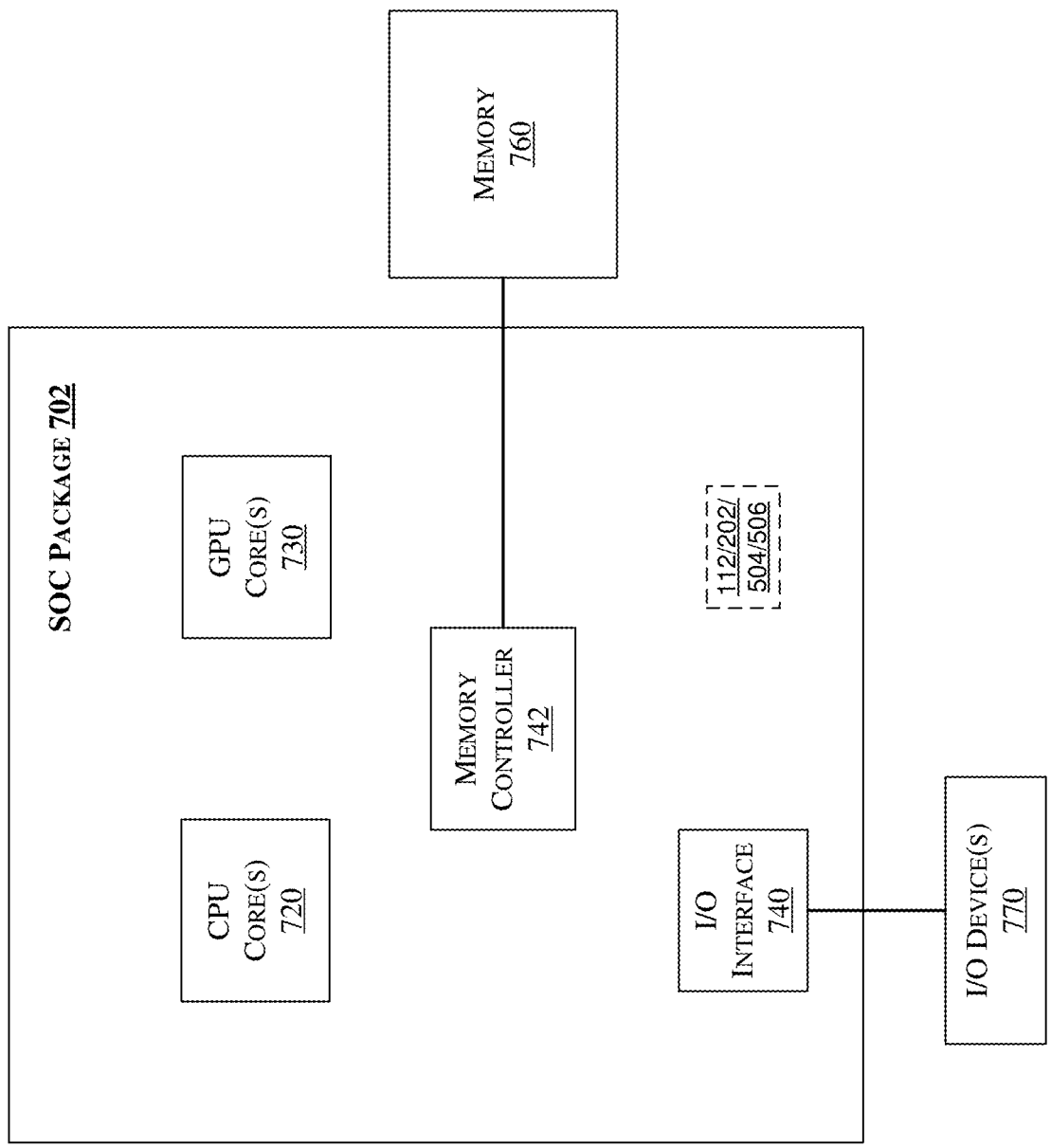
FIG. 7 illustrates a block diagram of an SOC (System On Chip) package in accordance with an embodiment.

FIG. 7 illustrates a block diagram of an SOC package in accordance with an embodiment. As illustrated in FIG. 7, SOC 702 includes one or more Central Processing Unit (CPU) cores 720, one or more Graphics Processor Unit (GPU) cores 730, an Input/Output (I/O) interface 740, and a memory controller 742. Various components of the SOC package 702 may be coupled to an interconnect or bus such as discussed herein with reference to the other figures. Also, the SOC package 702 may include more or less components, such as those discussed herein with reference to the other figures. Further, each component of the SOC package 702 may include one or more other components, e.g., as discussed with reference to the other figures herein. In one embodiment, SOC package 702 (and its components) is provided on one or more Integrated Circuit (IC) die, e.g., which are packaged into a single semiconductor device.

As illustrated in FIG. 7, SOC package 702 is coupled to a memory 760 via the memory controller 742. In an embodiment, the memory 760 (or a portion of it) can be integrated on the SOC package 702.

The I/O interface 740 may be coupled to one or more I/O devices 770, e.g., via an interconnect and/or bus such as discussed herein with reference to other figures. I/O device(s) 770 may include one or more of a keyboard, a mouse, a touchpad, a display, an image/video capture device (such as a camera or camcorder/video recorder), a touch screen, a speaker, or the like.

Figure 8:
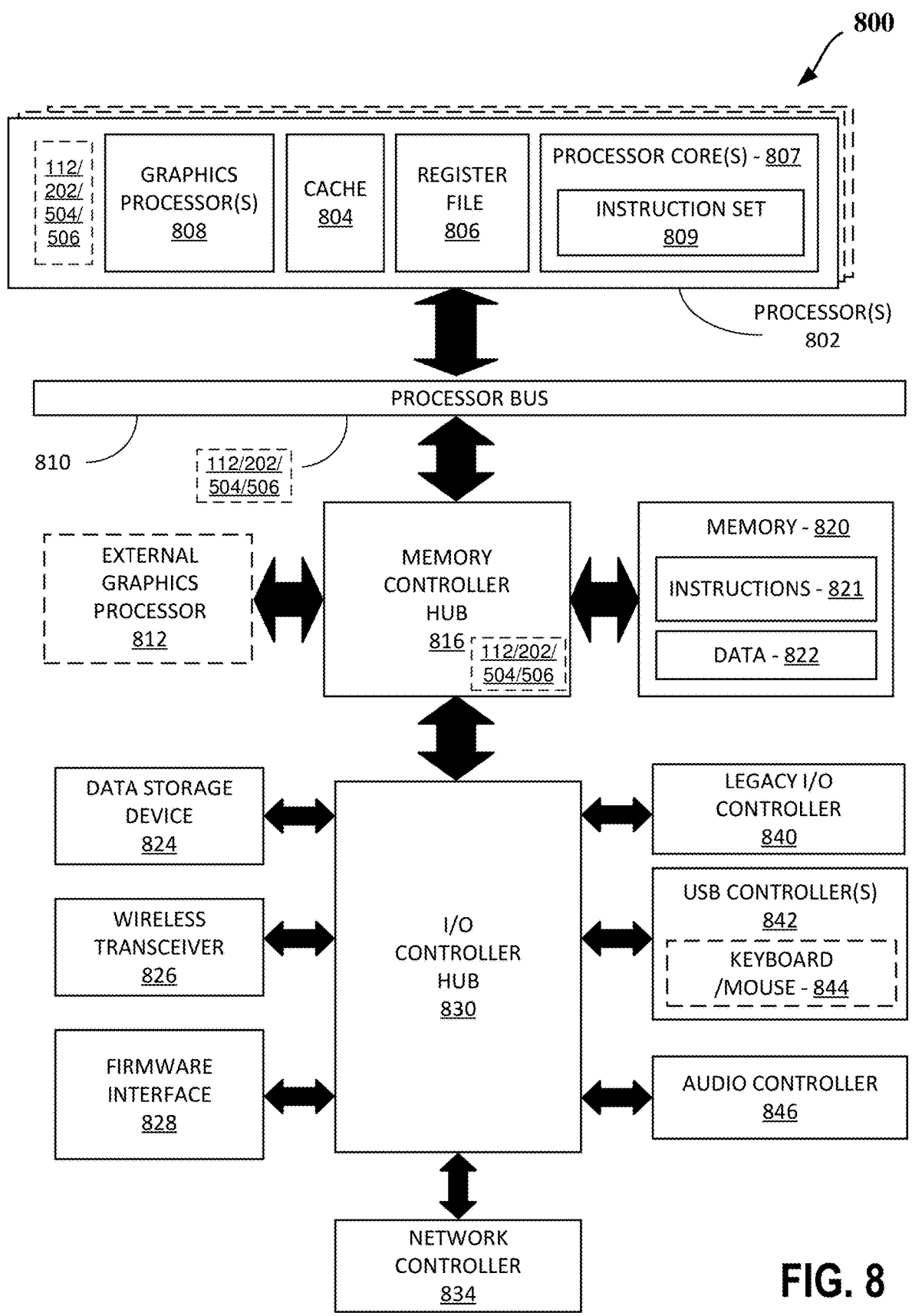
FIG. 8 is a block diagram of a processing system, according to an embodiment.

FIG. 8 is a block diagram of a processing system 800, according to an embodiment. In various embodiments the system 800 includes one or more processors 802 and one or more graphics processors 808, and may be a single processor desktop system, a multiprocessor workstation system, or a server system having a large number of processors 802 or processor cores 807. In on embodiment, the system 800 is a processing platform incorporated within a system-on-a-chip (SoC or SOC) integrated circuit for use in mobile, handheld, or embedded devices.

An embodiment of system 800 can include, or be incorporated within a server-based gaming platform, a game console, including a game and media console, a mobile gaming console, a handheld game console, or an online game console. In some embodiments system 800 is a mobile phone, smart phone, tablet computing device or mobile Internet device. Data processing system 800 can also include, couple with, or be integrated within a wearable device, such as a smart watch wearable device, smart eyewear device, augmented reality device, or virtual reality device. In some embodiments, data processing system 800 is a television or set top box device having one or more processors 802 and a graphical interface generated by one or more graphics processors 808.

In some embodiments, the one or more processors 802 each include one or more processor cores 807 to process instructions which, when executed, perform operations for system and user software. In some embodiments, each of the one or more processor cores 807 is configured to process a specific instruction set 809. In some embodiments, instruction set 809 may facilitate Complex Instruction Set Computing (CISC), Reduced Instruction Set Computing (RISC), or computing via a Very Long Instruction Word (VLIW). Multiple processor cores 807 may each process a different instruction set 809, which may include instructions to facilitate the emulation of other instruction sets. Processor core 807 may also include other processing devices, such a Digital Signal Processor (DSP).

In some embodiments, the processor 802 includes cache memory 804. Depending on the architecture, the processor 802 can have a single internal cache or multiple levels of internal cache. In some embodiments, the cache memory is shared among various components of the processor 802. In some embodiments, the processor 802 also uses an external cache (e.g., a Level-3 (L3) cache or Last Level Cache (LLC)) (not shown), which may be shared among processor cores 807 using known cache coherency techniques. A register file 806 is additionally included in processor 802 which may include different types of registers for storing different types of data (e.g., integer registers, floating point registers, status registers, and an instruction pointer register). Some registers may be general-purpose registers, while other registers may be specific to the design of the processor 802.

In some embodiments, processor 802 is coupled to a processor bus 810 to transmit communication signals such as address, data, or control signals between processor 802 and other components in system 800. In one embodiment the system 800 uses an exemplary 'hub' system architecture, including a memory controller hub 816 and an Input Output (I/O) controller hub 830. A memory controller hub 816 facilitates communication between a memory device and other components of system 800, while an I/O Controller Hub (ICH) 830 provides connections to I/O devices via a local I/O bus. In one embodiment, the logic of the memory controller hub 816 is integrated within the processor.

Memory device 820 can be a dynamic random access memory (DRAM) device, a static random access memory (SRAM) device, flash memory device, phase-change memory device, or some other memory device having suitable performance to serve as process memory. In one embodiment the memory device 820 can operate as system memory for the system 800, to store data 822 and instructions 821 for use when the one or more processors 802 executes an application or process. Memory controller hub 816 also couples with an optional external graphics processor 812, which may communicate with the one or more graphics processors 808 in processors 802 to perform graphics and media operations.

In some embodiments, ICH 830 enables peripherals to connect to memory device 820 and processor 802 via a high-speed I/O bus. The I/O peripherals include, but are not limited to, an audio controller 846, a firmware interface 828, a wireless transceiver 826 (e.g., Wi-Fi, Bluetooth), a data storage device 824 (e.g., hard disk drive, flash memory, etc.), and a legacy I/O controller 840 for coupling legacy (e.g., Personal System 2 (PS/2)) devices to the system. One or more Universal Serial Bus (USB) controllers 842 connect input devices, such as keyboard and mouse 844 combinations. A network controller 834 may also couple to ICH 830. In some embodiments, a high-performance network controller (not shown) couples to processor bus 810. It will be appreciated that the system 800 shown is exemplary and not limiting, as other types of data processing systems that are differently configured may also be used. For example, the I/O controller hub 830 may be integrated within the one or more processor 802, or the memory controller hub 816 and I/O controller hub 830 may be integrated into a discreet external graphics processor, such as the external graphics processor 812.

Figure 9:
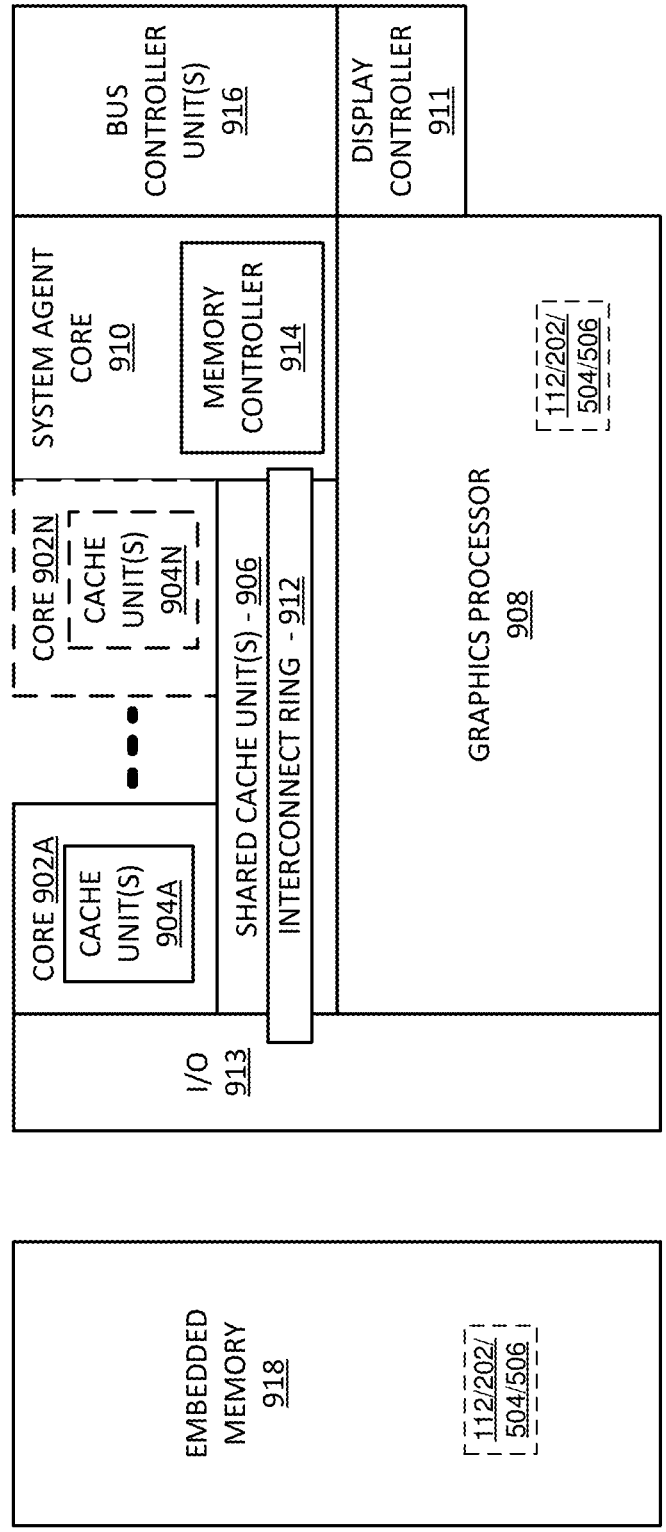
FIG. 9 is a block diagram of an embodiment of a processor having one or more processor cores, according to some embodiments.

FIG. 9 is a block diagram of an embodiment of a processor 900 having one or more processor cores 902A to 902N, an integrated memory controller 914, and an integrated graphics processor 908. Those elements of FIG. 9 having the same reference numbers (or names) as the elements of any other figure herein can operate or function in any manner similar to that described elsewhere herein, but are not limited to such. Processor 900 can include additional cores up to and including additional core 902N represented by the dashed lined boxes. Each of processor cores 902A to 902N includes one or more internal cache units 904A to 904N. In some embodiments each processor core also has access to one or more shared cached units 906.

The internal cache units 904A to 904N and shared cache units 906 represent a cache memory hierarchy within the processor 900. The cache memory hierarchy may include at least one level of instruction and data cache within each processor core and one or more levels of shared mid-level cache, such as a Level 2 (L2), Level 3 (L3), Level 4 (L4), or other levels of cache, where the highest level of cache before external memory is classified as the LLC. In some embodiments, cache coherency logic maintains coherency between the various cache units 906 and 904A to 904N.

In some embodiments, processor 900 may also include a set of one or more bus controller units 916 and a system agent core 910. The one or more bus controller units 916 manage a set of peripheral buses, such as one or more Peripheral Component Interconnect buses (e.g., PCI, PCI Express). System agent core 910 provides management functionality for the various processor components. In some embodiments, system agent core 910 includes one or more integrated memory controllers 914 to manage access to various external memory devices (not shown).

In some embodiments, one or more of the processor cores 902A to 902N include support for simultaneous multi-threading. In such embodiment, the system agent core 910 includes components for coordinating and operating cores 902A to 902N during multi-threaded processing. System agent core 910 may additionally include a power control unit (PCU), which includes logic and components to regulate the power state of processor cores 902A to 902N and graphics processor 908.

In some embodiments, processor 900 additionally includes graphics processor 908 to execute graphics processing operations. In some embodiments, the graphics processor 908 couples with the set of shared cache units 906, and the system agent core 910, including the one or more integrated memory controllers 914. In some embodiments, a display controller 911 is coupled with the graphics processor 908 to drive graphics processor output to one or more coupled displays. In some embodiments, display controller 911 may be a separate module coupled with the graphics processor via at least one interconnect, or may be integrated within the graphics processor 908 or system agent core 910.

In some embodiments, a ring based interconnect unit 912 is used to couple the internal components of the processor 900. However, an alternative interconnect unit may be used, such as a point-to-point interconnect, a switched interconnect, or other techniques, including techniques well known in the art. In some embodiments, graphics processor 908 couples with the ring interconnect 912 via an I/O link 913.

The exemplary I/O link 913 represents at least one of multiple varieties of I/O interconnects, including an on package I/O interconnect which facilitates communication between various processor components and a high-performance embedded memory module 918, such as an eDRAM (or embedded DRAM) module. In some embodiments, each of the processor cores 902 to 902N and graphics processor 908 use embedded memory modules 918 as a shared Last Level Cache.

In some embodiments, processor cores 902A to 902N are homogenous cores executing the same instruction set architecture. In another embodiment, processor cores 902A to 902N are heterogeneous in terms of instruction set architecture (ISA), where one or more of processor cores 902A to 902N execute a first instruction set, while at least one of the other cores executes a subset of the first instruction set or a different instruction set. In one embodiment processor cores 902A to 902N are heterogeneous in terms of micro-architecture, where one or more cores having a relatively higher power consumption couple with one or more power cores having a lower power consumption. Additionally, processor 900 can be implemented on one or more chips or as an SoC integrated circuit having the illustrated components, in addition to other components.

Figure 10:
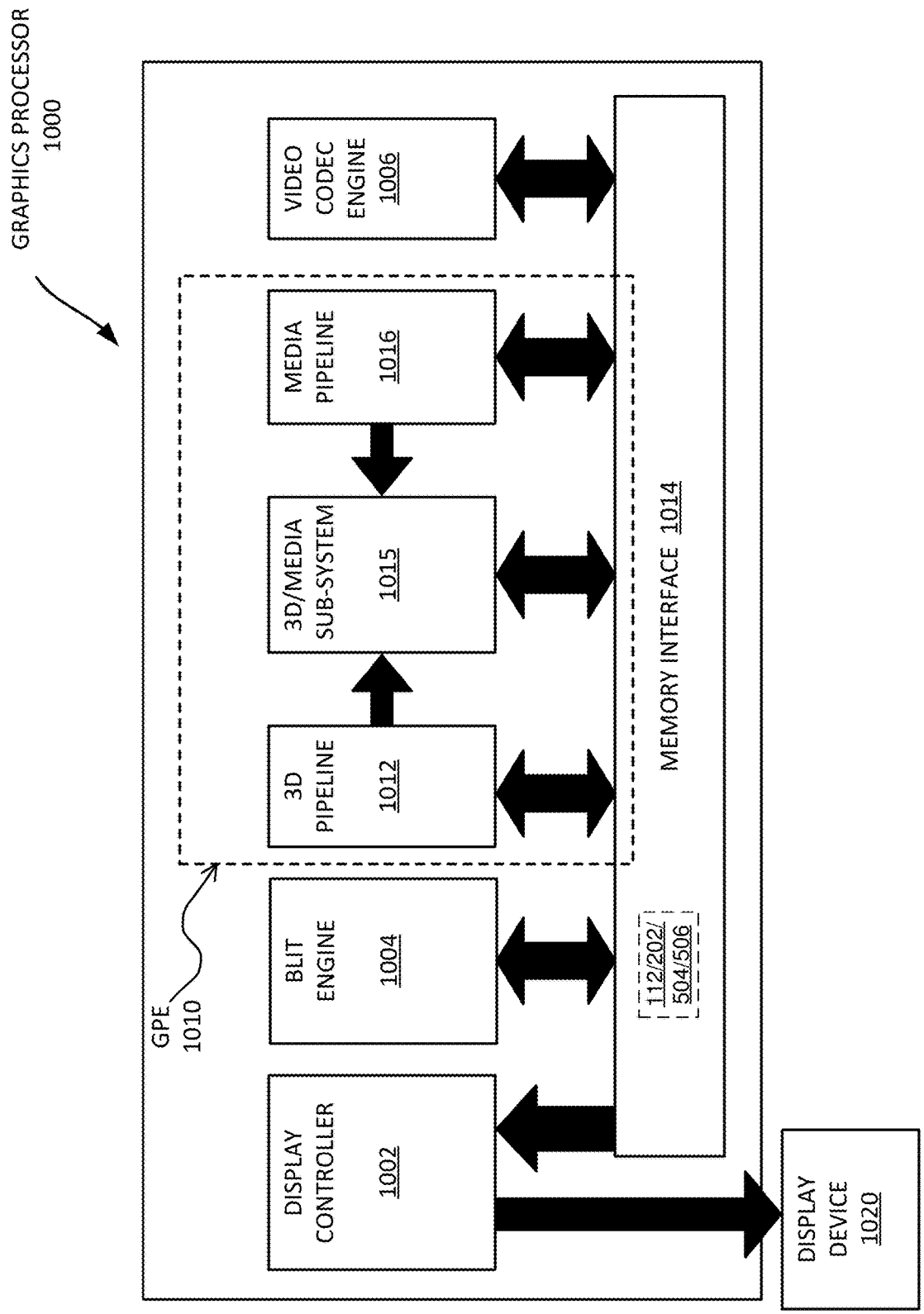
FIG. 10 is a block diagram of a graphics processor, according to an embodiment.

FIG. 10 is a block diagram of a graphics processor 1000, which may be a discrete graphics processing unit, or may be a graphics processor integrated with a plurality of processing cores. In some embodiments, the graphics processor communicates via a memory mapped I/O interface to registers on the graphics processor and with commands placed into the processor memory. In some embodiments, graphics processor 1000 includes a memory interface 1014 to access memory. Memory interface 1014 can be an interface to local memory, one or more internal caches, one or more shared external caches, and/or to system memory.

In some embodiments, graphics processor 1000 also includes a display controller 1002 to drive display output data to a display device 1020. Display controller 1002 includes hardware for one or more overlay planes for the display and composition of multiple layers of video or user interface elements. In some embodiments, graphics processor 1000 includes a video codec engine 1006 to encode, decode, or transcode media to, from, or between one or more media encoding formats, including, but not limited to Moving Picture Experts Group (MPEG) formats such as MPEG-2, Advanced Video Coding (AVC) formats such as H.264/MPEG-4 AVC, as well as the Society of Motion Picture & Television Engineers (SMPTE) 321M/VC-1, and Joint Photographic Experts Group (JPEG) formats such as JPEG, and Motion JPEG (MJPEG) formats.

In some embodiments, graphics processor 1000 includes a block image transfer (BLIT) engine 1004 to perform two-dimensional (2D) rasterizer operations including, for example, bit-boundary block transfers. However, in one embodiment, 3D graphics operations are performed using one or more components of graphics processing engine (GPE) 1010. In some embodiments, graphics processing engine 1010 is a compute engine for performing graphics operations, including three-dimensional (3D) graphics operations and media operations.

In some embodiments, GPE 1010 includes a 3D pipeline 1012 for performing 3D operations, such as rendering three-dimensional images and scenes using processing functions that act upon 3D primitive shapes (e.g., rectangle, triangle, etc.). The 3D pipeline 1012 includes programmable and fixed function elements that perform various tasks within the element and/or spawn execution threads to a 3D/Media sub-system 1015. While 3D pipeline 1012 can be used to perform media operations, an embodiment of GPE 1010 also includes a media pipeline 1016 that is specifically used to perform media operations, such as video post-processing and image enhancement.

In some embodiments, media pipeline 1016 includes fixed function or programmable logic units to perform one or more specialized media operations, such as video decode acceleration, video de-interlacing, and video encode acceleration in place of, or on behalf of video codec engine 1006. In some embodiments, media pipeline 1016 additionally includes a thread spawning unit to spawn threads for execution on 3D/Media sub-system 1015. The spawned threads perform computations for the media operations on one or more graphics execution units included in 3D/Media sub-system 1015.

In some embodiments, 3D/Media subsystem 1015 includes logic for executing threads spawned by 3D pipeline 1012 and media pipeline 1016. In one embodiment, the pipelines send thread execution requests to 3D/Media sub-system 1015, which includes thread dispatch logic for arbitrating and dispatching the various requests to available thread execution resources. The execution resources include an array of graphics execution units to process the 3D and media threads. In some embodiments, 3D/Media subsystem 1015 includes one or more internal caches for thread instructions and data. In some embodiments, the subsystem also includes shared memory, including registers and addressable memory, to share data between threads and to store output data.

In the following description, numerous specific details are set forth to provide a more thorough understanding. However, it will be apparent to one of skill in the art that the embodiments described herein may be practiced without one or more of these specific details. In other instances, well-known features have not been described to avoid obscuring the details of the present embodiments.

The following examples pertain to further embodiments. Example 1 includes an apparatus comprising: compression logic circuitry to compress input data and to store the compressed data in a temporary buffer, wherein the compression logic circuitry is to determine a first checksum value corresponding to the compressed data stored in the temporary buffer; and decompression logic circuitry to perform a decompress-verify operation and a copy operation, wherein the decompress-verify operation is to decompress the compressed data stored in the temporary buffer to determine a second checksum value corresponding to the decompressed data from the temporary buffer, wherein the copy operation is to transfer the compressed data from the temporary buffer to a destination buffer in response to a match between the first checksum value and the second checksum value. Example 2 includes the apparatus of example 1, wherein the decompressed data from the decompression logic circuitry is to be suppressed as an output to the destination buffer. Example 3 includes the apparatus of example 1, wherein the first checksum value and the second checksum value comprise Cyclic Redundancy Code (CRC) values. Example 4 includes the apparatus of example 1, wherein compression/decompression accelerator logic circuitry comprises the compression logic circuitry and the decompression logic circuitry. Example 5 includes the apparatus of example 4, wherein a cipher block in a decompression pipeline of the compression/decompression accelerator logic circuitry is to be reused to encrypt the compressed data enroute to the destination buffer. Example 6 includes the apparatus of example 1, comprising logic circuitry to determine whether the decompress-verify operation is enabled. Example 7 includes the apparatus of example 1, further comprising a decompression descriptor to store information corresponding to one or more of: a bit to indicate whether the decompress-verify operation is enabled, a source address, a destination address, one or more decompression flags, a source transfer size, and a maximum destination size. Example 8 includes the apparatus of example 1, wherein a processor, having one or more processor cores, comprises the compression logic circuitry and the decompression logic circuitry. Example 9 includes the apparatus of example 1, wherein the compressed data stored in the destination buffer is to be committed. Example 10 includes the apparatus of example 1, wherein a page fault is to be triggered in response to an access to the compressed data stored in the destination buffer, wherein the page fault is to cause the decompression logic circuitry to decompress the compressed data stored in the destination buffer.

Example 11 includes an apparatus comprising: decoder circuitry to decode an instruction, the instruction to include a field corresponding to a fused copy/transform operation enablement; and execution circuitry to execute the decoded instruction in accordance with the field to cause: compression logic circuitry to compress input data and to store the compressed data in a temporary buffer, wherein the compression logic circuitry is to determine a first checksum value corresponding to the compressed data stored in the temporary buffer; and decompression logic circuitry to perform a decompress-verify operation and a copy operation, wherein the decompress-verify operation is to decompress the compressed data stored in the temporary buffer to determine a second checksum value corresponding to the decompressed data from the temporary buffer, wherein the copy operation is to transfer the compressed data from the temporary buffer to a destination buffer in response to a match between the first checksum value and the second checksum value. Example 12 includes the apparatus of example 11, wherein execution of the instruction is to cause enqueuing of a request for a fused copy/transform operation. Example 13 includes the apparatus of example 12, wherein the request is to originate from a user space and bypass a kernel. Example 14 includes the apparatus of example 11, wherein the field is to comprise an address to a storage location that stores at least one bit indicative of the fused copy/transform operation enablement. Example 15 includes the apparatus of example 11, wherein the decompressed data from the decompression logic circuitry is to be suppressed as an output to the destination buffer. Example 16 includes the apparatus of example 11, wherein the first checksum value and the second checksum value comprise Cyclic Redundancy Code (CRC) values. Example 17 includes the apparatus of example 11, wherein a compression/decompression accelerator logic circuitry comprises the compression logic circuitry and the decompression logic circuitry. Example 18 includes the apparatus of example 17, wherein a cipher block in a decompression pipeline of the compression/decompression accelerator logic circuitry is to be reused to encrypt the compressed data enroute to the destination buffer.

Example 19 includes one or more non-transitory computer-readable media comprising one or more instructions that when executed on a processor configure the processor to perform one or more operations to cause: compression logic circuitry to compress input data and to store the compressed data in a temporary buffer, wherein the compression logic circuitry is to determine a first checksum value corresponding to the compressed data stored in the temporary buffer; and decompression logic circuitry to perform a decompress-verify operation and a copy operation, wherein the decompress-verify operation is to decompress the compressed data stored in the temporary buffer to determine a second checksum value corresponding to the decompressed data from the temporary buffer, wherein the copy operation is to transfer the compressed data from the temporary buffer to a destination buffer in response to a match between the first checksum value and the second checksum value. Example 20 includes the one or more computer-readable media of example 19, further comprising one or more instructions that when executed on the at least one processor configure the at least one processor to perform one or more operations to cause the decompressed data from the decompression logic circuitry is to be suppressed as an output to the destination buffer. Example 21 includes the one or more computer-readable media of example 19, wherein the first checksum value and the second checksum value comprise Cyclic Redundancy Code (CRC) values. Example 22 includes the one or more computer-readable media of example 19, further comprising one or more instructions that when executed on the at least one processor configure the at least one processor to perform one or more operations to cause determination of whether the decompress-verify operation is enabled. Example 23 includes the one or more computer-readable media of example 19, further comprising one or more instructions that when executed on the at least one processor configure the at least one processor to perform one or more operations to cause a decompression descriptor to store information corresponding to one or more of: a bit to indicate whether the decompress-verify operation is enabled, a source address, a destination address, one or more decompression flags, a source transfer size, and a maximum destination size. Example 24 includes the one or more computer-readable media of example 19, further comprising one or more instructions that when executed on the at least one processor configure the at least one processor to perform one or more operations to cause commitment of the compressed data stored in the destination buffer. Example 25 includes the one or more computer-readable media of example 19, further comprising one or more instructions that when executed on the at least one processor configure the at least one processor to perform one or more operations to cause triggering of a page fault in response to an access to the compressed data stored in the destination buffer, wherein the page fault is to cause the decompression logic circuitry to decompress the compressed data stored in the destination buffer.

Example 26 includes a method comprising: compressing, at compression logic circuitry, input data and to store the compressed data in a temporary buffer, wherein the compression logic circuitry is to determine a first checksum value corresponding to the compressed data stored in the temporary buffer; and performing a decompress-verify operation and a copy operation at decompression logic circuitry, wherein the decompress-verify operation decompresses the compressed data stored in the temporary buffer to determine a second checksum value corresponding to the decompressed data from the temporary buffer, wherein the copy operation transfers the compressed data from the temporary buffer to a destination buffer in response to a match between the first checksum value and the second checksum value. Example 27 includes the method of example 26, further comprising suppressing the decompressed data from the decompression logic circuitry as an output to the destination buffer. Example 28 includes the method of example 26, wherein the first checksum value and the second checksum value comprise Cyclic Redundancy Code (CRC) values. Example 29 includes the method of 19, further comprising performing one or more operations to cause determination of whether the decompress-verify operation is enabled. Example 30 includes the method of example 26, further comprising a decompression descriptor storing information corresponding to one or more of: a bit to indicate whether the decompress-verify operation is enabled, a source address, a destination address, one or more decompression flags, a source transfer size, and a maximum destination size. Example 31 includes the method of example 26, further comprising committing the compressed data stored in the destination buffer. Example 32 includes the method of example 26, further comprising triggering of a page fault in response to an access to the compressed data stored in the destination buffer, wherein the page fault causes the decompression logic circuitry to decompress the compressed data stored in the destination buffer.

Example 33 includes an apparatus comprising means to perform a method as set forth in any preceding example. Example 34 includes machine-readable storage including machine-readable instructions, when executed, to implement a method or realize an apparatus as set forth in any preceding example.

In various embodiments, one or more operations discussed with reference to FIG. 1 et seq. may be performed by one or more components (interchangeably referred to herein as "logic") discussed with reference to any of the figures.

In various embodiments, the operations discussed herein, e.g., with reference to FIG. 1 et seq., may be implemented as hardware (e.g., logic circuitry), software, firmware, or combinations thereof, which may be provided as a computer program product, e.g., including one or more tangible (e.g., non-transitory) machine-readable or computer-readable media having stored thereon instructions (or software procedures) used to program a computer to perform a process discussed herein. The machine-readable medium may include a storage device such as those discussed with respect to the figures.

Additionally, such computer-readable media may be downloaded as a computer program product, wherein the program may be transferred from a remote computer (e.g., a server) to a requesting computer (e.g., a client) by way of data signals provided in a carrier wave or other propagation medium via a communication link (e.g., a bus, a modem, or a network connection).

Reference in the specification to "one embodiment" or "an embodiment" means that a particular feature, structure, and/or characteristic described in connection with the embodiment may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Thus, although embodiments have been described in language specific to structural features and/or methodological acts, it is to be understood that claimed subject matter may not be limited to the specific features or acts described. Rather, the specific features and acts are disclosed as sample forms of implementing the claimed subject matter.

The invention claimed is:

1. An apparatus comprising:
    compression logic circuitry to compress input data and to store the compressed data in a temporary buffer, wherein the compression logic circuitry is to determine a first checksum value corresponding to the compressed data stored in the temporary buffer; and
    decompression logic circuitry to perform a decompress-verify operation and a copy operation,
    wherein the decompress-verify operation is to decompress the compressed data stored in the temporary buffer to determine a second checksum value corresponding to the decompressed data from the temporary buffer, wherein the copy operation is to transfer the compressed data from the temporary buffer to a destination buffer in response to a match between the first checksum value and the second checksum value, wherein a page fault is to be triggered in response to an access to the compressed data stored in the destination buffer, wherein the page fault is to cause the decompression logic circuitry to decompress the compressed data stored in the destination buffer.

2. The apparatus of claim 1, wherein the decompressed data from the decompression logic circuitry is to be suppressed as an output to the destination buffer.

3. The apparatus of claim 1, wherein the first checksum value and the second checksum value comprise Cyclic Redundancy Code (CRC) values.

4. The apparatus of claim 1, wherein compression/decompression accelerator logic circuitry comprises the compression logic circuitry and the decompression logic circuitry.

5. The apparatus of claim 4, wherein a cipher block in a decompression pipeline of the compression/decompression accelerator logic circuitry is to be reused to encrypt the compressed data enroute to the destination buffer.

6. The apparatus of claim 1, comprising logic circuitry to determine whether the decompress-verify operation is enabled.

7. The apparatus of claim 1, further comprising a decompression descriptor to store information corresponding to one or more of: a bit to indicate whether the decompress-verify operation is enabled, a source address, a destination address, one or more decompression flags, a source transfer size, and a maximum destination size.

8. The apparatus of claim 1, wherein a processor, having one or more processor cores, comprises the compression logic circuitry and the decompression logic circuitry.

9. The apparatus of claim 1, wherein the compressed data stored in the destination buffer is to be committed.

10. An apparatus comprising:
    decoder circuitry to decode an instruction, the instruction to include a field corresponding to a fused copy/transform operation enablement; and
    execution circuitry to execute the decoded instruction in accordance with the field to cause:
    compression logic circuitry to compress input data and to store the compressed data in a temporary buffer, wherein the compression logic circuitry is to determine a first checksum value corresponding to the compressed data stored in the temporary buffer; and
    decompression logic circuitry to perform a decompress-verify operation and a copy operation,
    wherein the decompress-verify operation is to decompress the compressed data stored in the temporary buffer to determine a second checksum value corresponding to the decompressed data from the temporary buffer, wherein the copy operation is to transfer the compressed data from the temporary buffer to a destination buffer in response to a match between the first checksum value and the second checksum value, wherein a page fault is to be triggered in response to an access to the compressed data stored in the destination buffer, wherein the page fault is to cause the decompression logic circuitry to decompress the compressed data stored in the destination buffer.

11. The apparatus of claim 10, wherein execution of the instruction is to cause enqueuing of a request for a fused copy/transform operation.

12. The apparatus of claim 11, wherein the request is to originate from a user space and bypass a kernel.

13. The apparatus of claim 10, wherein the field is to comprise an address to a storage location that stores at least one bit indicative of the fused copy/transform operation enablement.

14. The apparatus of claim 10, wherein the decompressed data from the decompression logic circuitry is to be suppressed as an output to the destination buffer.

15. The apparatus of claim 10, wherein the first checksum value and the second checksum value comprise Cyclic Redundancy Code (CRC) values.

16. The apparatus of claim 10, wherein a compression/decompression accelerator logic circuitry comprises the compression logic circuitry and the decompression logic circuitry.

17. The apparatus of claim 16, wherein a cipher block in a decompression pipeline of the compression/decompression accelerator logic circuitry is to be reused to encrypt the compressed data enroute to the destination buffer.

18. One or more non-transitory computer-readable media comprising one or more instructions that when executed on a processor configure the processor to perform one or more operations to cause:

compression logic circuitry to compress input data and to store the compressed data in a temporary buffer, wherein the compression logic circuitry is to determine a first checksum value corresponding to the compressed data stored in the temporary buffer; and decompression logic circuitry to perform a decompress-verify operation and a copy operation, wherein the decompress-verify operation is to decompress the compressed data stored in the temporary buffer to determine a second checksum value corresponding to the decompressed data from the temporary buffer, wherein the copy operation is to transfer the compressed data from the temporary buffer to a destination buffer in response to a match between the first checksum value and the second checksum value, wherein a page fault is to be triggered in response to an access to the compressed data stored in the destination buffer, wherein the page fault is to cause the decompression logic circuitry to decompress the compressed data stored in the destination buffer.

19. The one or more non-transitory computer-readable media of claim 18, further comprising one or more instructions that when executed on the at least one processor configure the at least one processor to perform one or more operations to cause the decompressed data from the decompression logic circuitry is to be suppressed as an output to the destination buffer.

20. The one or more non-transitory computer-readable media of claim 18, wherein the first checksum value and the second checksum value comprise Cyclic Redundancy Code (CRC) values.

21. The one or more non-transitory computer-readable media of claim 18, further comprising one or more instructions that when executed on the at least one processor configure the at least one processor to perform one or more operations to cause determination of whether the decompress-verify operation is enabled.

22. The one or more non-transitory computer-readable media of claim 18, further comprising one or more instructions that when executed on the at least one processor configure the at least one processor to perform one or more operations to cause a decompression descriptor to store information corresponding to one or more of: a bit to indicate whether the decompress-verify operation is enabled, a source address, a destination address, one or more decompression flags, a source transfer size, and a maximum destination size.

23. The one or more non-transitory computer-readable media of claim 18, further comprising one or more instructions that when executed on the at least one processor configure the at least one processor to perform one or more operations to cause commitment of the compressed data stored in the destination buffer.

* * * * *